US010832953B2

(12) United States Patent
Wietstruck et al.

(10) Patent No.: US 10,832,953 B2
(45) Date of Patent: Nov. 10, 2020

(54) TECHNOLOGICAL METHOD FOR PREVENTING, BY MEANS OF BURIED ETCH STOP LAYERS, THE CREATION OF VERTICAL/LATERAL INHOMOGENEITIES WHEN ETCHING THROUGH-SILICON VIAS

(71) Applicant: IHP GMBH—INNOVATIONS FOR HIGH PERFORMANCE MICROELECTRONICS/LEIBNIZ-INSTITUT FUR INNOVATIVE MIKROELEKTRONIK, Frankfurt (DE)

(72) Inventors: Matthias Wietstruck, Berlin (DE); Mehmet Kaynak, Frankfurt (DE); Philip Kulse, Frankfurt (DE); Marco Lisker, Frankfurt (DE); Steffen Marschmeyer, Lebus (DE); Dirk Wolansky, Frankfurt (DE)

(73) Assignee: IHP GMBH—INNOVATIONS FOR HIGH PERFORMANCE MICROELECTRONICS/LEIBNIZ-INSTITUT FUR INNOVATIVE MIKROELEKTRONIK, Frankfurt (DE)

( * ) Notice: Subject to any disclaimer, the term of this patent is extended or adjusted under 35 U.S.C. 154(b) by 100 days.

(21) Appl. No.: 15/718,480

(22) Filed: Sep. 28, 2017

(65) Prior Publication Data
US 2018/0286751 A1    Oct. 4, 2018

(30) Foreign Application Priority Data
Oct. 5, 2016 (DE) ......................... 10 2016 219 275

(51) Int. Cl.
*H01L 21/768* (2006.01)
*H01L 23/48* (2006.01)
(Continued)

(52) U.S. Cl.
CPC .... *H01L 21/76898* (2013.01); *H01L 21/3086* (2013.01); *H01L 21/30604* (2013.01); (Continued)

(58) Field of Classification Search
CPC .......... H01L 21/3086; H01L 21/30604; H01L 21/486; H01L 21/6835; H01L 21/76802; (Continued)

(56) References Cited

U.S. PATENT DOCUMENTS

2005/0221601 A1* 10/2005 Kawano ............ H01L 21/76898
438/622
2007/0052067 A1    3/2007 Umemoto
(Continued)

FOREIGN PATENT DOCUMENTS

JP    2008 021739 A    1/2008

*Primary Examiner* — Brigitte A Paterson
(74) *Attorney, Agent, or Firm* — Ware, Fressola, Maguire & Barber LLP (57) ABSTRACT

Method for producing a semiconductor device by providing a silicon wafer having a plurality of equal height raised portions on a first surface thereof; depositing an etch stop layer on the first surface; planarizing a surface of the etch stop layer; permanently bonding a first carrier wafer on the etch stop layer surface; producing components on or in a second wafer surface in a FEOL process; etching a plurality of trenches into the wafer, each trench formed at the respective location of one of the raised portions; depositing side wall insulation layers on side walls of the trenches; forming through-silicon vias by filling the trenches with electrically conductive material; producing a conductor path stack in a BEOL process for contacting the active components on the second surface; temporarily bonding a second carrier wafer onto a surface of the conductor path stack; removing the first carrier wafer and exposing the vias.

12 Claims, 5 Drawing Sheets

(51) Int. Cl.
*H01L 21/306* (2006.01)
*H01L 21/308* (2006.01)
*H01L 21/683* (2006.01)
*H01L 21/78* (2006.01)
*H01L 23/528* (2006.01)
*H01L 23/66* (2006.01)

(52) U.S. Cl.
CPC .......... *H01L 21/6835* (2013.01); *H01L 21/78* (2013.01); *H01L 23/481* (2013.01); *H01L 23/528* (2013.01); *H01L 23/66* (2013.01); *H01L 2221/68359* (2013.01); *H01L 2223/6616* (2013.01)

(58) Field of Classification Search
CPC ......... H01L 21/76819; H01L 21/76843; H01L 21/76877; H01L 21/76898; H01L 21/78; H01L 23/481; H01L 23/528; H01L 23/66; H01L 2221/68359; H01L 2223/6616
See application file for complete search history.

(56) References Cited

U.S. PATENT DOCUMENTS

| | | |
|---|---|---|
| 2009/0243074 A1 | 10/2009 | Ramiah et al. |
| 2011/0241214 A1 | 10/2011 | Feng et al. |
| 2012/0261826 A1 | 10/2012 | Kuo et al. |
| 2015/0064899 A1* | 3/2015 | Ji ................... H01L 21/76898 438/614 |
| 2015/0187647 A1* | 7/2015 | Gong ............... H01L 21/76898 257/621 |
| 2016/0020145 A1* | 1/2016 | Lee ..................... H01L 23/5226 438/400 |
| 2016/0118339 A1* | 4/2016 | Kar-Roy ............ H01L 23/481 257/763 |
| 2016/0247779 A1* | 8/2016 | Yu ........................ H01L 21/563 |
| 2016/0372416 A1* | 12/2016 | Gambino ............ H01L 29/0649 |

\* cited by examiner

FIG. 1A

PRIOR ART

FIG. 1B

PRIOR ART

TECHNOLOGICAL METHOD FOR PREVENTING, BY MEANS OF BURIED ETCH STOP LAYERS, THE CREATION OF VERTICAL/LATERAL INHOMOGENEITIES WHEN ETCHING THROUGH-SILICON VIAS

CROSS REFERENCE TO RELATED APPLICATION

This application claims priority under 35 USC § 119 to German Patent Application No. 10 2016 219 275.2 filed on Oct. 5, 2016, which application is hereby incorporated by reference in its entirety.

TECHNICAL FIELD

The invention relates to a method for producing semiconductor devices, in particular wafers having through-silicon vias (TSVs).

BACKGROUND OF THE INVENTION

Figure 1A:
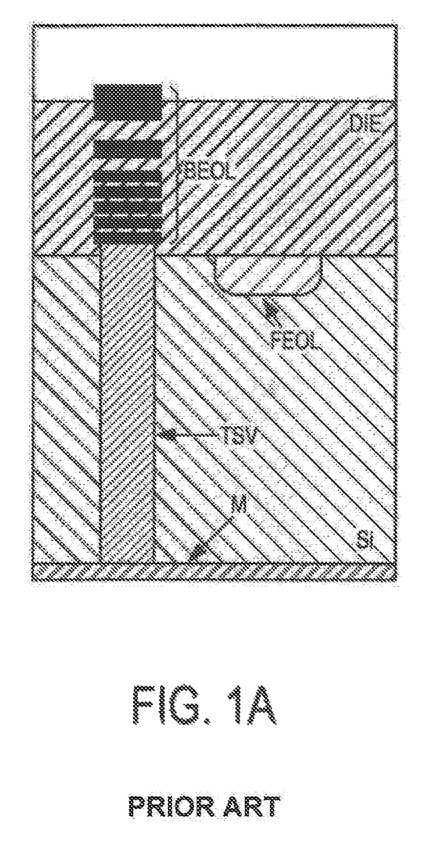
FIG. 1A shows a schematic view of a CMOS/BiCMOS chip with a through-silicon via according to the prior art.

The integration of vertical vias through the silicon substrate, that is to say through-silicon vias, is a technique that is used, for example, for high-frequency grounding in low-noise amplifiers (LNAs) and power amplifiers (PAs), as well as for signal transfer for three-dimensionally stacked CMOS/BiCMOS chips. The basic architecture of a silicon (Si)-based chip with TSVs is shown in FIG. 1A. The back-end-of-line (BEOL) conductor path stack arranged in a dielectric (DiE) is conductively connected, through the silicon substrate (Si), by a through-silicon via (TSV) to backside metallization.

Figure 1B:
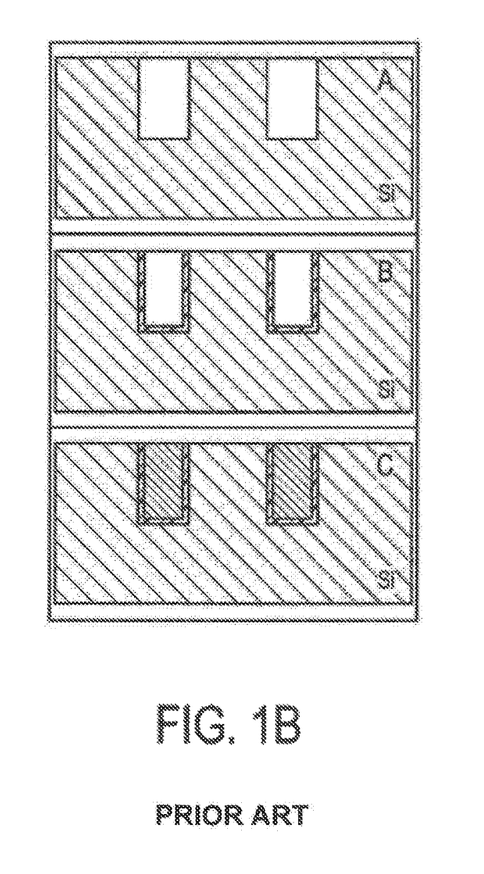
FIG. 1B shows a schematic view of the steps for integrating through-silicon vias in the via-middle process according to the prior art.

Various concepts have been designed for integrating TSVs within CMOS/BiCMOS technologies. These concepts mainly differ in the way that TSVs are integrated into the front-end-of-line (FEOL) and the back-end-of-line processes of such technologies. A distinction is made between a via-first (before production of the FEOL), a via-middle (between FEOL and BEOL production) and a via-last approach (after BEOL production). Regardless of the integration concept, the fabrication of TSVs is a process consisting of the following three steps: A) etching deep trenches with high aspect ratios using the Bosch process, B) depositing an insulation layer to electrically insulate the TSV from the silicon substrate, C) filling the trenches with electrically conductive material. These steps are shown in FIG. 1B.

Figure 2A:
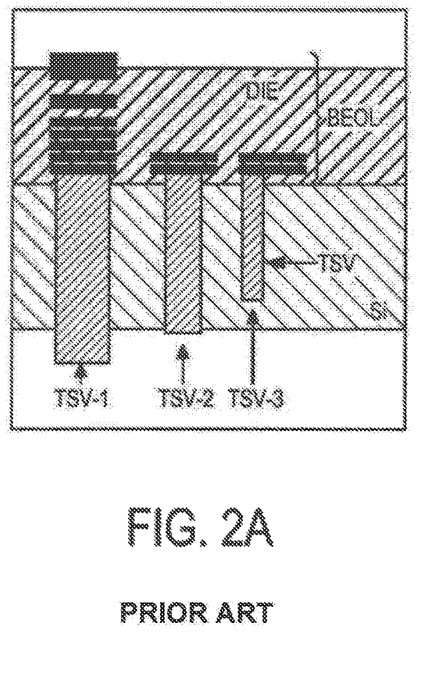
FIG. 2A shows a schematic view of a CMOS/BiCMOS chip with three prior art through-silicon vias of different depths.

One important structural parameter of TSVs is their resultant depth, as this determines their electrical properties. The depth of TSVs and hence the substrate depth that can subsequently be realized is determined by the etching process for producing the deep trenches. Since that dry etch process and the resultant depth of the TSVs is crucially dependent on the geometry and in particular the surface of the TSVs, only TSV structures having the same geometry and resulting in a uniform length can be used on a wafer in the prior art. It is necessary to set a defined and constant TSV depth across the wafer, because during subsequent exposure and contacting of the TSVs from the wafer backside, different TSV depths would lead to deeper TSVs being exposed earlier in the process, whereas TSVs with less depth would still be buried in the substrate and therefore cannot be contacted electrically, as lucidly shown in FIG. 2A. Whereas TSV-1 protrudes too strongly from the substrate, TSV-2 is the ideal case of a TSV with minimal protrusion over the surface of the silicon wafer, whereas TSV-3 is not yet exposed.

Figure 2B:
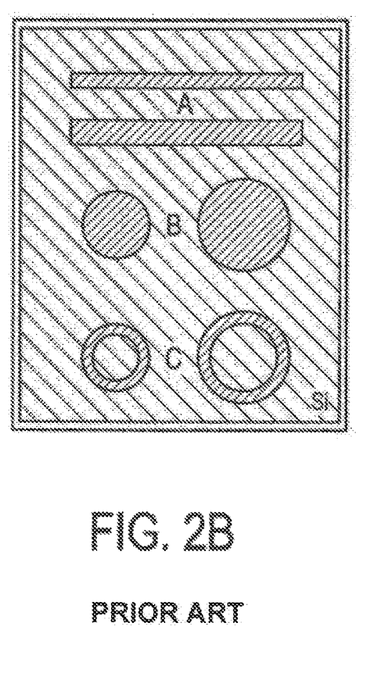
FIG. 2B shows a schematic view of different through-silicon via structures according to the prior art.

Examples of different TSV geometries are shown by in FIG. 2B. The "A" structures show TSV bars, the "B" structures show TSV cylinders and the "C" structures show hollow TSV cylinders, i.e. an annular structure, in each case in cross-section.

SUMMARY OF THE INVENTION

According to the invention, a method for producing a semiconductor device is proposed, comprising the steps of:
   providing a silicon wafer having a plurality of raised portions of equal height on a first surface of the silicon wafer as a placeholder for through-silicon vias;
   depositing an etch stop layer on the first surface of the silicon wafer;
   planarizing a surface of the etch stop layer;
   permanently bonding a first carrier wafer to the surface of the etch stop layer;
   producing components on or in a second surface of the silicon wafer in a front-end-of-line process;
   etching a plurality of trenches into the silicon wafer using a masked etching process, proceeding from the second surface of the silicon wafer, each trench being formed at the respective location of one raised portion of the plurality of raised portions;
   depositing side wall insulation layers made of insulating material on side walls of the trenches;
   forming through-silicon vias by filling the trenches with electrically conductive material;
   producing a conductor path stack in a back-end-of-line process for contacting the active components on the second surface of the silicon wafer;
   temporarily bonding a second carrier wafer onto a surface of the conductor path stack;
   removing the first carrier wafer; and
   exposing the through-silicon vias by partially removing the etch stop layer.

The invention is based on the realization that a uniform TSV length can be obtained by using a buried three-dimensional layer which serves as a vertical and horizontal etch stop when etching the deep TSV trenches. This means that the etching process is defined and limited not only in depth, but also in width, by the previously implemented structure of the etch stop layer resulting from the original raised portions. Each of these etch stop layers can be produced using CMOS/BiCMOS technology that is basically known from the prior art and which can therefore be well integrated into existing production processes. The concept behind the method is based on standard processes for TSV integration, as well as on methods for temporary and permanent wafer bonding. The method according to the first aspect of the invention thus allows TSVs to be produced with uniform depth in a straightforward method and with little additional process effort. Integrating the buried etch stop layer in the silicon substrate, i.e. in the combination of silicon wafer and first carrier wafer, during the etching process allows the length and depth of the individual TSVs to be defined and a uniform depth for all the TSVs to be set during the silicon etching process, due to the etch stop layer being used as a vertical and a lateral stop.

Different TSV structures, i.e., TSVs with different cross-sectional geometries, can be implemented in a wafer by the etch stop layer, but without such an etch stop they would be produced at different depths. The invention is based on the finding that the formation of TSVs with different depths can be prevented using an etch stop layer. Only with TSVs of uniform depth is it possible to expose the TSVs from the backside of the wafer without problems arising. The three-dimensional design of the etch stop layer which surrounds the surface of the silicon wafer and in particular the raised portions thereon, and which planarizes them only to the extent that the raised portions are still surrounded completely by the etch stop layer, serves as a mold for forming subsequent TSVs and specifies, in combination with the thickness of the silicon wafer, the depth of the TSVs. What the method according to the invention achieves, therefore, is that TSVs of different geometries and uniform depth can be realized together on one wafer.

According to a second aspect, the invention therefore relates to an active silicon wafer comprising a plurality of components and a plurality of through-silicon vias, wherein the plurality of through-silicon vias includes at least two through-silicon vias having different geometries and wherein all the through-silicon vias of the plurality of through-silicon vias have a uniform depth. According to a third aspect, the invention relates to a chip comprising a plurality of components and a plurality of through-silicon vias, wherein the plurality of through-silicon vias includes at least two through-silicon vias having different geometries and wherein all the through-silicon vias of the plurality of through-silicon vias have a uniform depth. Realizing different TSV geometries on one wafer or chip allows the TSVs on the wafer or chip to be adapted individually to the respective requirements of the components and therefore the contacting of the respective components to be optimized. With the aid of the invention, it is possible not only for TSVs with minimal impedances, i.e., TSV bars, but also for TSVs with minimized parasitic substrate capacitances, i.e., TSV cylinders, to be realized in one chip, thus allowing the advantages of different TSV geometries to be exploited in a versatile manner.

Since different TSV structures may be advantageous, depending on the specific application, such as TSV bars for achieving minimum impedances and inductances for high-frequency grounding, or annular TSV structures for minimizing parasitic substrate capacitances for high-frequency signal transmission, a technological way of producing different TSV structures on one wafer is of decisive importance. The invention achieves this, and for the first time ever provides wafers and chips which combine different TSV structures.

Some embodiments of the method according to the invention and of the devices according to the invention shall now be described. The additional features of the embodiments may be combined with each other to form other embodiments, unless they are explicitly described as alternatives to each other.

In one variant, the method for producing a semiconductor device comprises, after the step of exposing the through-silicon vias, the additional steps of:

depositing a metallization layer on the etch stop layer;
structuring the metallization layer; and
debonding the second carrier wafer.

This completes the process of producing a wafer as a semiconductor device. The final product of this method is an active silicon wafer comprising a plurality of components with complete contacting. In another variant, the silicon wafer is diced into single chips in an additional step after the step of debonding the second carrier wafer.

In one preferred variant of the method, the etch stop layer comprises an insulating material such as $SiO_2$. This allows the etch stop layer to be used as an insulating layer between the silicon wafer and the metallization layer after the TSVs have been exposed. In this way, the additional step of depositing an insulating layer can be avoided.

In another variant, the silicon wafer and/or the first carrier wafer is thinned before the active components are produced. This is advantageous for setting desired wafer thicknesses independently of the standardized thicknesses of the initial wafers, i.e., of the unprocessed silicon wafer or the first carrier wafer. It is advantageous, more particularly, if the silicon wafer is set to a final thickness for the semiconductor device by thinning the silicon wafer. This obviates the need for subsequent thinning in steps in which other components are already implemented in or on the wafer and would be adversely affected by the thinning process.

In one variant of the method, the step of providing a silicon wafer having a plurality of raised portions of equal height on a first surface of the silicon wafer as a placeholder for through-silicon vias comprises the following steps:

providing a silicon wafer; and
producing a plurality of raised portions of equal height on the first surface of the silicon wafer.

It is advantageous, in particular, when the plurality of raised portions is produced with an etching process, for example by using masks. Raised portions can be produced particularly inexpensively and efficiently, and with many different geometries, with the aid of etching processes.

In another variant, at least one raised portion of the plurality of raised portions is produced with a geometry selected from a cylinder, a cuboid or a square. These geometries for raised portions allows the subsequent TSVs to be produced in the form of TSV cylinders or hollow TSV cylinders, or as TSV bard having a predefined length and width. The dimensions of the raised portions, such as their diameter, width and length, define the subsequent dimensions of the masks for etching the trenches and the resultant TSV structures. With annular masking is used in the process of etching the trenches, cylindrical raised portions are produced from hollow TSV cylinders.

It is particularly advantageous when at least two raised portions of the plurality of raised portions are produced with different geometries. This allows the plurality of TSVs to be produced with different geometries in the process, and ultimately allows TSVs with differing geometries but with a uniform depth to be realized.

BRIEF DESCRIPTION OF THE DRAWINGS

Further embodiments of the invention shall now be described with reference to the attached drawings, in which.

DETAILED DESCRIPTION

Reference has already been made to FIGS. 1A to 2B in the introductory section above.

Figure 3A:
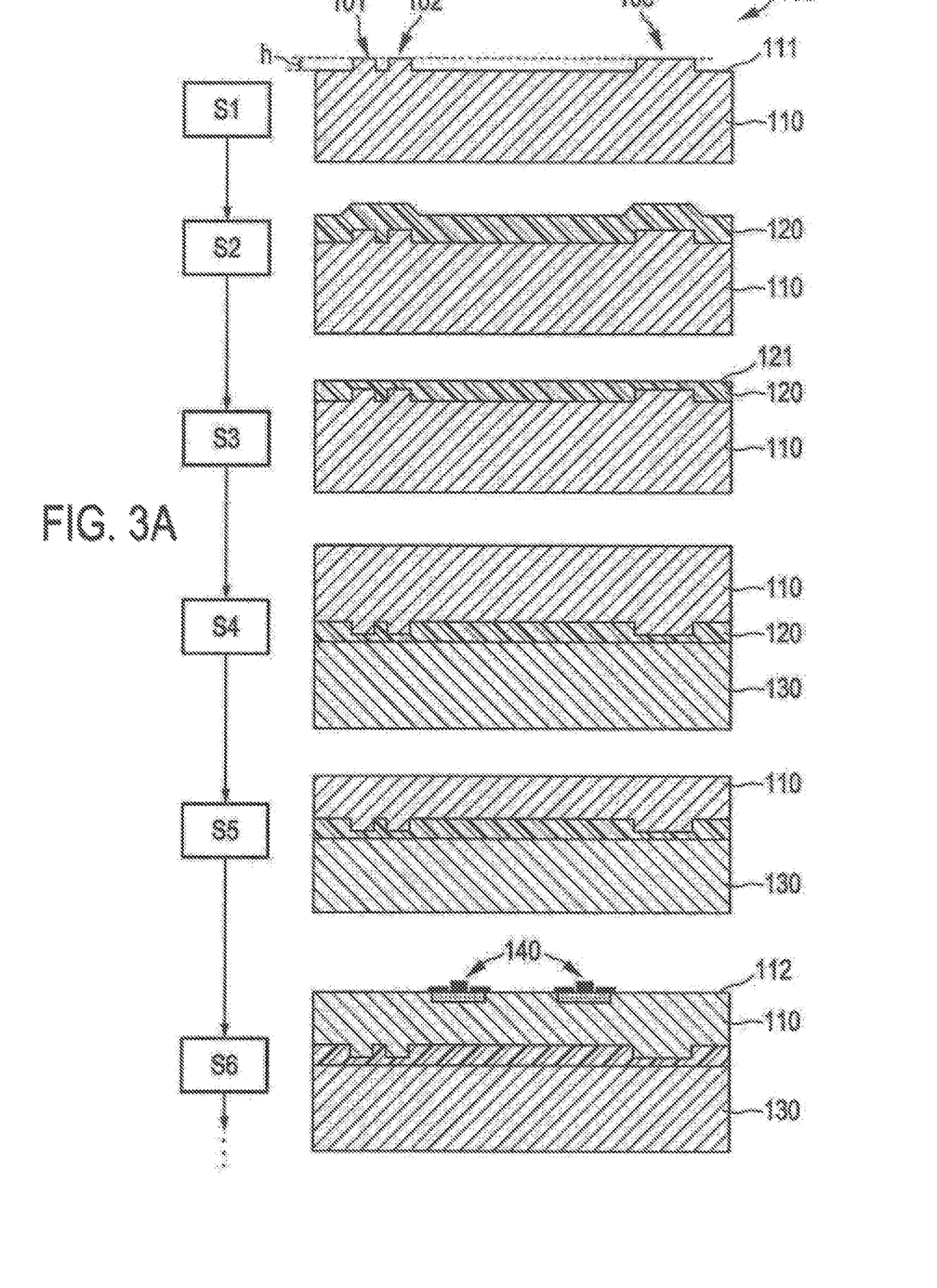
FIGS. 3A to 3C show a flow diagram of an embodiment of a method for producing a semiconductor device, with schematic views of the semiconductor device in different stages of the method.
Figure 3B:
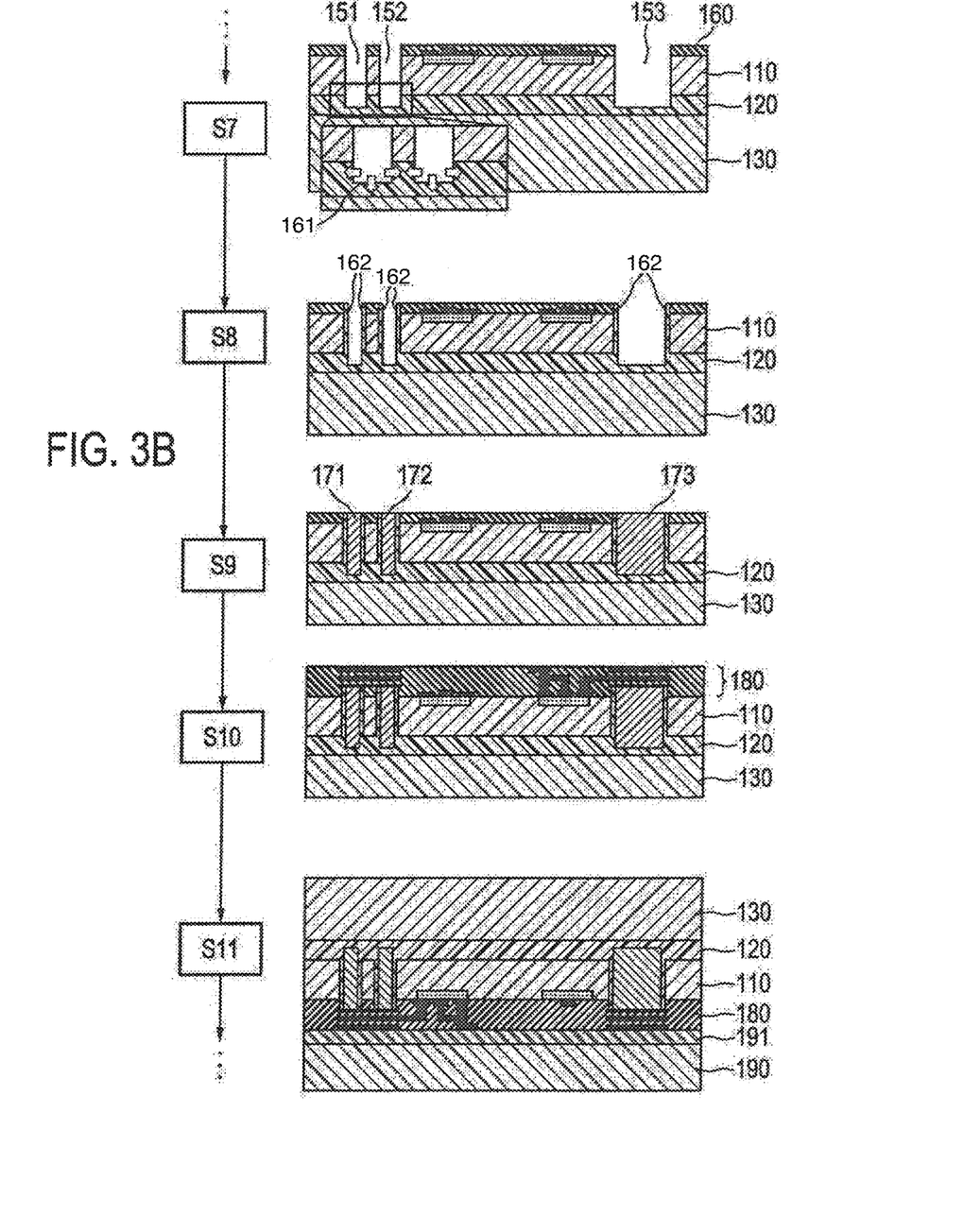
Figure 3C:
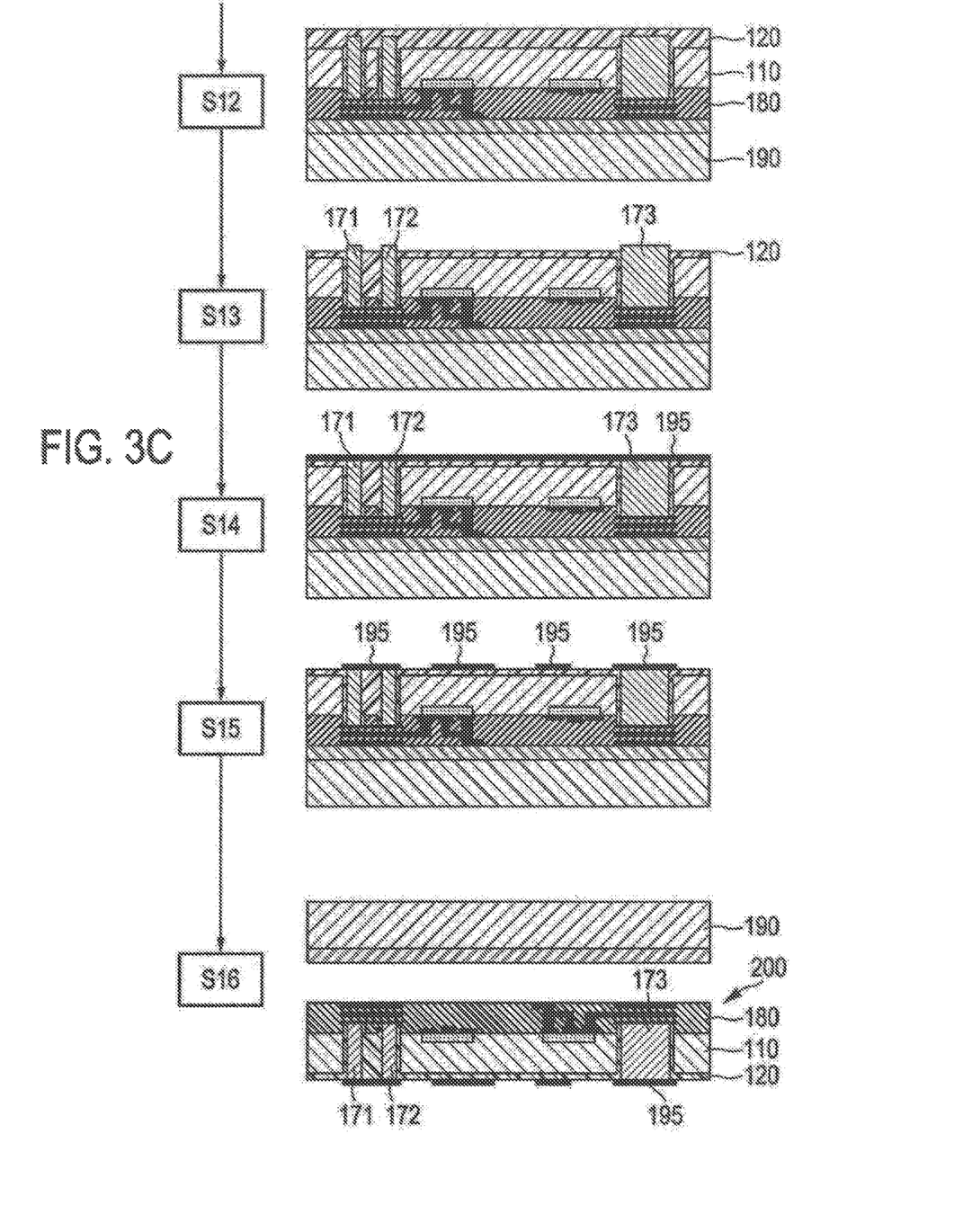

FIGS. 3A to 3C show a method for producing a semiconductor device 100 according to the first aspect of the invention. In step S1, a silicon wafer 110 having a plurality of raised portions 101, 102, 103 of equal height h are provided on a first surface 111 of silicon wafer 110. In the further course of the method, raised portions 101, 102, 103 serve as placeholders for through-silicon vias. The cross-sectional geometry of the raised portions is substantially the same as the cross-sectional geometry of the through-silicon vias that ensue. As can be seen clearly in FIG. 3A, the thicknesses of raised portions 101 and 103 differ significantly. In the embodiment shown here, raised portions 101, 102, 103 were produced on an unprocessed silicon wafer by silicon etching. In step S3, an etch stop layer 120 is deposited on the first surface 111 of silicon wafer 110. Etch stop layer 120 is made here of insulating material and can thus serve as an insulating layer when the semiconductor device is subsequently used. The layer thickness of the etch stop layer is significantly greater in the embodiment shown than the height h of the raised portions. In step S2 that follows, a surface 121 of etch stop layer 120 is planarized. Etch stop layer 120 is planarized by chemical and mechanical polishing in order to ensure an excellent surface quality, especially with regard to roughness and topography.

In step S4, the silicon wafer is joined to a first carrier wafer in a top-down permanent wafer bonding process. In other words, a first carrier wafer is permanently bonded to the surface 121 of etch stop layer 120. Etch stop layer 120 is now buried as an etch stop layer in a composite structure comprising the silicon wafer and the first carrier wafer. In an optional step S5, silicon wafer 110 and the first carrier wafer 130 are then thinned to a respectively desired thickness. This can be done using mechanical, chemical and/or chemical/mechanical grinding, polishing and/or etching processes. The final thickness of the silicon wafer is determined directly by the thinning of the silicon wafer, whereas the thickness of the first carrier wafer can be adapted so as to set the total thickness of the composite structure. In step S6, components 140 are produced on or in a second surface 112 of silicon wafer 110, in particular active components in a front-end-of-line process. The permanent bonding process is preferably chosen so that the forces necessary to bond the silicon substrate and the first carrier wafer are not reduced by high process temperatures, thus ensuring high bonding stability. The previously described processes for integrating the TSVs, using the via-middle approach, are then carried out.

In the next step S7 of the method, which is shown in FIG. 38, a plurality of trenches are etched into the silicon wafer in a masked etching process. The etching process proceeds from the second surface 112 of silicon wafer 110 each trench 151, 152, 153 is formed at the respective location of a raised portion 101, 102, 103 of the plurality of raised portions. The selected etching process in the embodiment shown here is the Bosch process, i.e., deep reactive silicon-ion etching using a mask 160. The novelty of the method is manifested in this step especially, in that when the buried etch stop layer 120 is reached, a lateral and vertical etch stop is effected, as indicated by arrows 161 in the more detailed, highlighted view. This means that the etching process is defined and limited not only in depth, but also in width, by the previously implemented structure of the etch stop layer resulting from the original raised portions. In step S8 that then follows, the side wall insulation layers 162 made of insulating material are deposited on side walls of trenches 151, 152, 153, and in step S9 the trenches or holes are filled with electrically conductive material (e.g. Cu, W, Poly-Si or carbon nanotubes CNT), thus forming TSVs 171, 172, 173. In step S10, a conductor path stack 180 is then produced in a back-end-of-line process, for contacting the active components on the second surface of the silicon wafer. This follows on from the BEOL fabrication process, and when step S10 reaches its final state, the TSVs are buried in the substrate of the silicon wafer. A carrier wafer handling process for handling thin wafers is used to expose the TSVs. To that end, a second carrier wafer 190 is temporarily bonded to a surface of the conductor path stack in step S11. In the embodiment shown here, a bonding layer 191 is used. The composite structure consisting of silicon wafer 110 and the first carrier wafer 130 is temporarily bonded top-down via bonding layer 191 to a second carrier wafer 190.

In step S12, shown in FIG. 3C, the first carrier wafer is subsequently removed, for example by mechanical, chemical and/or mechanical/chemical grinding, polishing and/or etching processes. The previously buried etch stop layer 120 is exposed as a result and can be used directly as an insulating layer for backside metallization or backside wiring and does not have to be produced in an additional process. In step S13, through-silicon vias 171, 172, 173 are then exposed by partially removing etch stop layer 120. This is done using chemical and/or chemical/mechanical polishing or etching processes. In a further step S14 in this embodiment of the method, a metallization layer 195 is deposited on the etch stop layer, thus providing TSVs 171, 172, 173 with electrical contacts and connecting them to each other. In step S15, metallization layer 195 is structured. In a further step S16, the second carrier wafer is removed in a debonding process. An active silicon wafer 200 with TSVs 171, 172, 173 and backside metallization 195 has thus been produced. TSVs 171, 172, 173 of the active silicon wafer 200 have different geometries, yet have a uniform depth. In a further step which is not shown here, the active silicon wafer 200 is now diced to form a plurality of chips each likewise having TSVs with different geometries but with the same depth.

What is claimed is:

1. A method for producing a semiconductor device, comprising the steps of:
    providing a silicon wafer having a plurality of raised portions of equal height on a first surface of the silicon wafer as a placeholder for through-silicon vias;
    depositing an etch stop layer on the first surface of the silicon wafer;
    planarizing a surface of the etch stop layer;
    using a wafer bonding process to bond a first carrier wafer to the surface of the etch stop layer;
    producing components on or in a second surface of the silicon wafer in a front-end-of-line process;
    etching a plurality of trenches into the silicon wafer using a masked etching process, proceeding from the second surface of the silicon wafer, each trench being formed at the respective location of one raised portion of the plurality of raised portions;
    depositing side wall insulation layers made of insulating material on side walls of the trenches;
    forming through-silicon vias by filling the trenches with electrically conductive material;
    producing a conductor path stack in a back-end-of-line process for contacting the active components on the second surface of the silicon wafer;

temporarily bonding a second carrier wafer onto a surface of the conductor path stack;

removing the first carrier wafer; and exposing the through-silicon vias by partially removing the etch stop layer.

2. The method according to claim 1, comprising, after the step of exposing the through-silicon vias, the additional steps of:

depositing a metallization layer on the etch stop layer;

structuring the metallization layer; and debonding the second carrier wafer.

3. The method according to claim 2, wherein the silicon wafer and/or the first carrier wafer is thinned before the active components are produced.

4. The method according to claim 3, in which the silicon wafer is set to a final thickness for the semiconductor device by thinning the silicon wafer.

5. The method according to claim 2, in which the step of providing the silicon wafer having a plurality of raised portions of equal height on a first surface of the silicon wafer as a placeholder for through-silicon vias comprises the steps of:

providing the silicon wafer; and then producing the plurality of raised portions of equal height on the first surface of the silicon wafer.

6. The method according to claim 5, in which the plurality of raised portions is produced using an etching process.

7. The method according to claim 1, in which at least one raised portion of the plurality of raised portions is produced with a geometry selected from a cylinder, a cuboid or a square.

8. The method according to claim 1, in which at least two raised portions of the plurality of raised portions are produced with different geometries.

9. The method according to claim 1, in which the silicon wafer is diced into single chips after debonding the second carrier wafer.

10. The method according to claim 1, wherein the silicon wafer and/or the first carrier wafer is thinned before the active components are produced.

11. The method according to claim 10, in which the silicon wafer is set to a final thickness for the semiconductor device by thinning the silicon wafer.

12. The method according to claim 1, in which the step of providing a silicon wafer having a plurality of raised portions of equal height on a first surface of the silicon wafer as a placeholder for through-silicon vias comprises the steps of:

providing the silicon wafer; and then producing the plurality of raised portions of equal height on the first surface of the silicon wafer.

* * * * *